United States Patent [19]

Yamada et al.

[11] Patent Number: 4,686,606
[45] Date of Patent: Aug. 11, 1987

[54] DEVICE FOR COOLING INTEGRATED CIRCUIT CHIP

[75] Inventors: Minoru Yamada, Iruma; Mitsuru Usui, Yokohama; Akira Masaki, Tokyo; Keiichirou Nakanishi, Kokubunji; Masahide Tokuda, Hachioji, all of Japan

[73] Assignee: Hitachi, Ltd., Tokyo, Japan

[21] Appl. No.: 827,613

[22] Filed: Feb. 10, 1986

[30] Foreign Application Priority Data

Mar. 4, 1985 [JP] Japan .................................. 60-41118

[51] Int. Cl.$^4$ .............................................. H05K 7/20
[52] U.S. Cl. .................................. 361/385; 165/80.4; 357/82
[58] Field of Search ................................ 361/382–388; 357/81, 82; 165/80, 104.33; 174/15 R

[56] References Cited

U.S. PATENT DOCUMENTS 4,558,395 12/1985 Yamada .............................. 361/385
4,567,505 1/1986 Pease .................................... 357/82

FOREIGN PATENT DOCUMENTS 0038771 3/1979 Japan ..................................... 357/82

OTHER PUBLICATIONS

Balde, Res., IBM Tech Discl Bull, vol. 20, No. 11A, Apr. 1978, p. 4336, "Liquid Cooling of-Package".
Bergles, IBM Tech Discl. Bull, vol. 22, No. 8A, Jan. 1980, p. 3318, "Two-Piece Cold Plate-Surface".
Berndlmaier, IBM Tech Discl. Bull, vol. 20, No. 11B, Apr. 1978, p. 4817, "Liquid-Metal-Cooled-Structures".
Electronics (Jun. 16, 1982), vol. 55, No. 12, p. 143, "Thermal-Chips", Barbour.
"Microcapillary Thermal Interface Technology for VLSI Packaging", David B. Tuckerman and R. Fabian Pease.

Primary Examiner—G. P. Tolin
Attorney, Agent, or Firm—Antonelli, Terry & Wands

[57] ABSTRACT

A cooling structure for cooling a multichip module for effectively removing heat generated from integrated circuit chips. A suction plate formed with minute grooves on one of its surfaces is disposed between each integrated circuit chip and an associated cooling block and is brought into contact at a grooved surface with the integrated circuit chip through a layer of a liquid such as silicone oil interposed therebetween, thereby producing negative hydrostatic pressure by capillary action of the minute grooves. The suction plate has a thickness small enough to be bent under influence of the negative hydrostatic pressure to follow a warping of the integrated circuit chip, so that the clearance between the opposing surfaces of the suction plate and the integrated circuit chip can be minimized. Thus, an integrated circuit chip cooling device of surface-to-surface contact type operable with a low thermal resistance is provided, which can improve the maintainability and reliability without sacrificing the cooling efficiency.

20 Claims, 6 Drawing Figures

DEVICE FOR COOLING INTEGRATED CIRCUIT CHIP

BACKGROUND OF THE INVENTION

This invention relates to a multichip module, and more particularly to a cooling structure cooling a multichip module for effectively removing heat generated from integrated circuit chips.

In for example U.S. application Ser. Nos. 604,003 now U.S. Pat. No. 4,558395 and 665,548, now U.S. Pat. No. 4,644,385, it has been proposed to provide a cooling structure for cooling a multichip module comprising a plurality of integrated circuit chips mounted on a single wiring substrate.

In the proposed cooling structure, a plurality of cooling blocks, connected by flexible pipes, are secured to or brought into contact with the respective individual integrated circuit chips, so that cooling efficiency can be greatly improved. From the aspect of maintenance and reliability, it is desirable to bring each of the cooling blocks into contact with the associated integrated circuit chip instead of securing the cooling block to the integrated circuit chip. When the cooling block is brought into contact with the associated integrated circuit chip, it is important, for the reduction of the thermal resistance, that the clearance between the opposing contact surfaces of the cooling block and integrated circuit chip be as small as possible. However, because of the manufacturing process, a warp of several μm or more inevitably remains on these contact surfaces, especially, on the contact surface of the integrated circuit chip, and this warping has restricted the desired reduction in lower limit of the clearance between the opposing contact surfaces of the cooling block and integrated circuit chip, hence, the lower limit of the thermal resistance.

In view of the future tendency toward a larger size of integrated circuit chips and a more complicated multi-layer interconnections, the warping of the integrated circuit chip is expected to increase.

Therefore, for a further improvement of the cooling efficiency, a cooling structure is required which can correct the undesirable warping of the contact surface of the integrated circuit chip and which can further decrease the clearance between the opposing contact surfaces of the integrated circuit chip and cooling block.

In this connection, David B. Tuckerman and R. Fabian Pease proposed a new cooling structure in a paper entitled "Microcapillary Thermal Interface Technology for VLSI Package" in 1983 Symposium on VLSI Technology, Maui, Digest of Technical Papers pp. 60-61. According to their proposal, a cooling block formed with very small or minute grooves on its contact surface is brought into contact with an integrated circuit chip through a layer of silicone oil interposed between their contact surfaces. The principle of the proposed cooling structure is that undesirable warping of the integrated circuit chip is corrected by utilization of negative hydrostatic pressure produced by the capillary action of the minute grooves.

However, in the case of a multichip module in which it is necessary to secure a plurality of integrated circuit chips to a wiring substrate as by controlled collapse bonding (CCB), it is difficult to correct warping of the integrated circuit chips by utilization of the negative hydrostatic pressure.

SUMMARY OF THE INVENTION

It is a primary object of the present invention to provide an integrated circuit chip cooling device of surface-to-surface contact type which operates with high cooling efficiency and which is highly satisfactory in maintainability and reliability because of a structure in which a cooling member makes contact with an associated integrated circuit chip with a low thermal resistance therebetween.

In accordance with the cooling device of the present invention, a suction plate is disposed between a cooling block and an associated integrated circuit chip. Minute grooves are formed on one surface of the suction plate, and the suction plate makes contact at the grooved surface with the integrated circuit chip through a layer of fluid such as silicone oil interposed therebetween so as to produce warp-correcting negative hydrostatic pressure by the capillary action. Further, the thickness of the suction plate is selected to be small enough to cause bending of the suction plate to conform to or follow up warping of the integrated circuit chip under influence of the negative hydrostatic pressure, so that the clearance between the opposing contact surfaces of the suction plate and integrated circuit chip can be decreased or minimized. A fluid having a high thermal conductivity such as, for example a liquid metal is charged in the contact area between the other surface of the suction plate and the lower surface of the cooling block to provide a low thermal resistance at the junction. The integrated circuit chip can be easily separated from the suction plate when it becomes necessary to remove the integrated circuit chip from the cooling device for the purpose of maintenance and inspection, for example, when replacement of the integrated circuit chip is required.

DETAILED DESCRIPTION

The present invention will now be described in detail with reference to the drawings.

Figure 1:
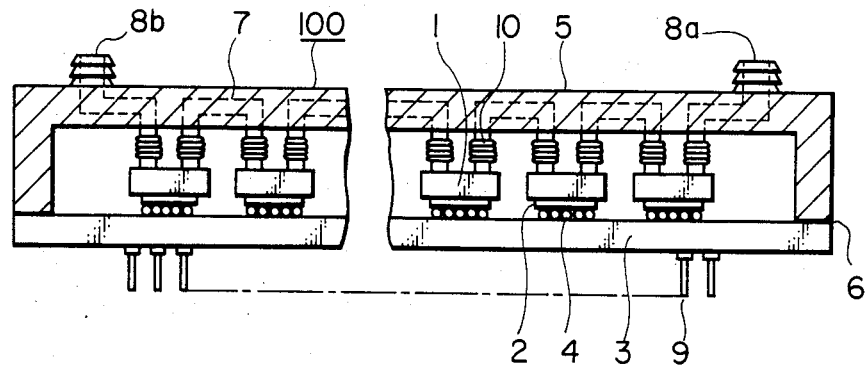
FIG. 1 is a schematic sectional view of a preferred embodiment of the cooling device according to the present invention.

Referring now to the drawings wherein like reference numerals are used throughout the various views to designate like parts and, more particularly, to FIG. 1, according to this figure the integrated circuit chip coolig device designated generally by the reference numeral 100 provides means for enclosing and cooling a plurality of integrated circuit chips 2. With Sealing being effected by bonding a hat 5 to a wiring substrate 3 by solder 6. The plurality of integrated circuit chips 2 are electrically interconnected through soldered terminals 4 on the upper surface of the wiring substrate 3, and a plurality of input/output pins 9 for electrically connecting the cooling device 100 to a circuit card or a circuit board are provided on the lower surface of the wiring substrate 3.

Heat generated from the integrated circuit chips 2 is transmitted to a cooling member 1 mounted on each of the integrated circuit chips 2 and is removed by a coolant circulating through the cooling members 1. The coolant is externally supplied into the cooling device through an inlet nozzle 8a to circulate the interior of the individual cooling members 1 through bellows-like flexible pipe members 10 capable of making expansion and contraction in a direction orthogonal with respect to the wiring substrate 3 and is finally discharged through an outlet nozzle 8b to the exterior of the cooling device.

Figure 2:
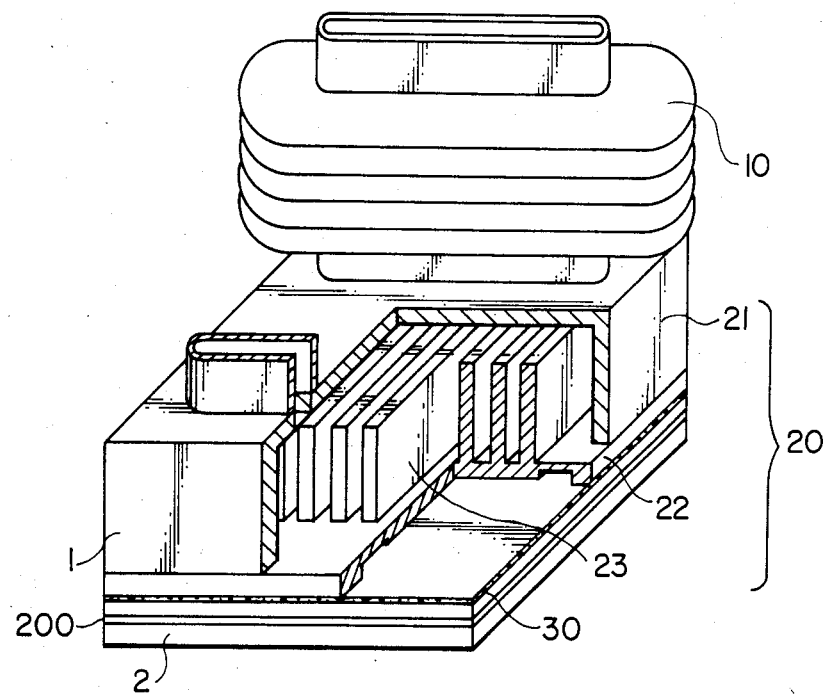
FIG. 2 is an enlarged, partly cut-away, schematic perpsective view of the cooling member and the associated integrated circuit chip shown in FIG. 1.

As shown in FIG. 2, a layer of silicon oil 200 is interposed between the cooling member 1 the associated integrated circuit chip 2. The cooling member 1 includes a cooling block 20 and a suction plate 30. With the cooling block 20 including a cap 21 and a bottom plate 22 having a plurality of cooling fins 23 formed or molded integrally therewith. The material of the cooling fins 23 is preferably a metal having a high thermal conductivity such as, for example, copper, aluminum or molybdenum or a ceramics having a high thermal conductivity such as silicon carbide ceramics. The cap 21 is coupled to the bottom plate 22 as by soldering or diffusion bonding. The flexible pipe members 10 are each in the form of, for example, a bellows of electroformed nickel and are coupled to the top wall of the cap 21 as by soldering. The flexible pipes members or bellows 10 are connected to a coolant passage 7 formed in the hat 5 overlying the cooling members 1.

In accordance with the present invention, the bellows 10 has a flat-oval sectional shape so as to increase its sectional area. Because of such a sectional shape, the velocity of the coolant flowing through the bellows 10 is decreased so as to reduce the pressure loss in the bellows 10 and, also, to prevent corrosion of the bellows 10. These bellows 10 of flat-oval sectional shape are disposed on both ends, respectively, of the fin array so as to make uniform the quantity of the coolant flowing through the space between the cooling fins 23.

Figure 3:
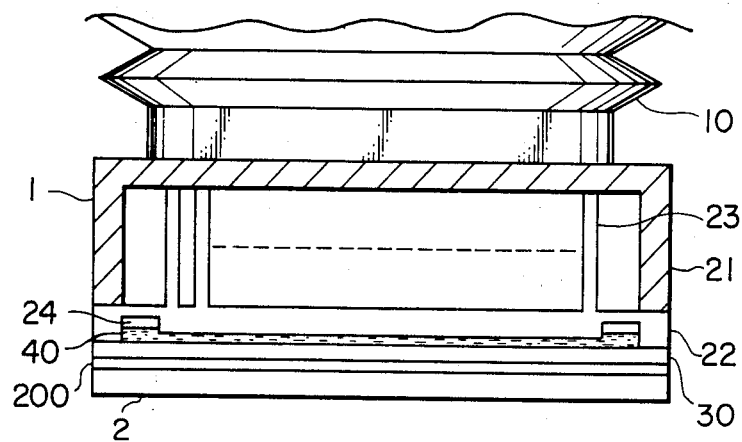
FIG. 3 is a schematic sectional view of the cooling member and the integrated circuit chip shown in FIG. 2.

As shown in FIG. 3 a space is provided between the suction plate 30 and the bottom plate 22 of the cooling block 20, and a fluid 40 having a high thermal conductivity, for example, a liquid metal such as a Ga-In-Sn alloy is enclosed in the space. When the material of the cooling fins 23 is copper, aluminum or the like, the area of the fins 23 making contact with the liquid metal is plated with chromium, nickel or the like so as to improve the corrosion resistance of the fins 23. A cavity 24 is formed near the marginal edges of the bottom plate 22 of the cooling block 20 to serve as a liquid metal reservoir. The suction plate 30 and the bottom plate 22 of the cooling block 20 are secured together at their outer peripheral portions as by soldering.

Figure 4:
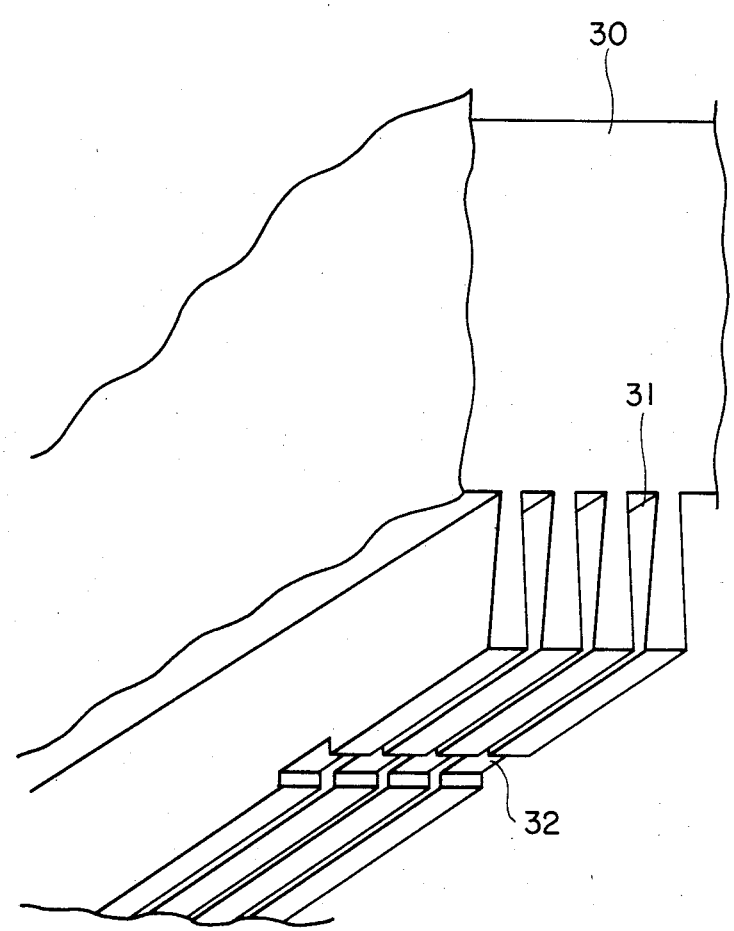
FIG. 4 is an enlarged, schematic perspective view of part of the suction plate shown in FIG. 2.

As shown in FIG. 4, the bottom or chip contacting surface of the suction plate 30 includes minute grooves 31, each of which is widest at its upper end and becomes progressively narrower toward the integrated circuit chip 2, with the minute grooves 31 being formed on the entire bottom surface of the suction plate 30. Cavities 32 are provided to permit communication between the grooves 31. In the embodiment of FIG. 4, the material of the suction plate 30 is silicon, and an anisotropic etching technique and a plating technique as described in detail in the aforementioned Tuckerman's paper are employed to form the suction plate 30 of the cooling member 1.

In the embodiment of FIG. 4, the grooves 31 have a depth of 30 $\mu$m, a pitch of 10 $\mu$m, an uppermost width of 4 $\mu$m and a lowermost width of 1 $\mu$m, and the suction plate 30 has a thickness of 100 $\mu$m.

The suction plate 30 of the cooling member 1 is brought into contact with the associated integrated circuit chip 2 with the silicone oil layer 200 interposed therebetween, and negative hydrostatic pressure is produced by the capillary action of the grooves 31 of the suction plate 30. As a result, the suction plate 30 is deflected or bent to follow up warping of the integrated circuit chip 2, thereby minimizing the clearance between the opposing contact surfaces of the suction plate 30 and integrated circuit chip 2.

Heat generated from the integrated circuit chip 2 is finally transmitted to the coolant through the silicone oil layer 200, suction plate 30, liquid metal 40, bottom plate 22 and cooling fins 23.

Presuming that the integrated circuit chip 2 having a sectional area of 2 cm $\times$ 2 cm has a warp of 15 $\mu$m. Even in such a case, negative hydrostatic pressure of about 400 gf/cm$^2$ is produced in the embodiment of FIG. 4, thereby decreasing the clearance between the opposing contact surfaces to less than 1 $\mu$m. Therefore, when the thermal conductivity of the silicone oil 200 is 0.0015 W/cm·K, the thermal resistance per cm$^2$ of the contact area of the integrated circuit chip 2 can be reduced to a very small value of about 0.02 K/W.

Also, since the heat transmission path except the opposing contact surfaces is quite short and it made of the material having a high thermal conductivity, the total thermal resistance of the heat transmission path from the integrated circuit chip 2 to the coolant can be reduced to a very small value of less than 0.5 K/W per cm$^2$ of the integrated circuit chip 2.

The multichip module need not necessarily be placed in a horizontal position. When the quantity of the liquid metal 40 and the volume of the liquid metal reservoir 24 are suitably selected so that the liquid metal is always filled between the opposing surfaces of the suction plate 30 and the bottom plate 22 of the cooling block 20 in each of the cooling members 1, it is apparent that the multichip module may be placed in a vertical position.

Figure 5:
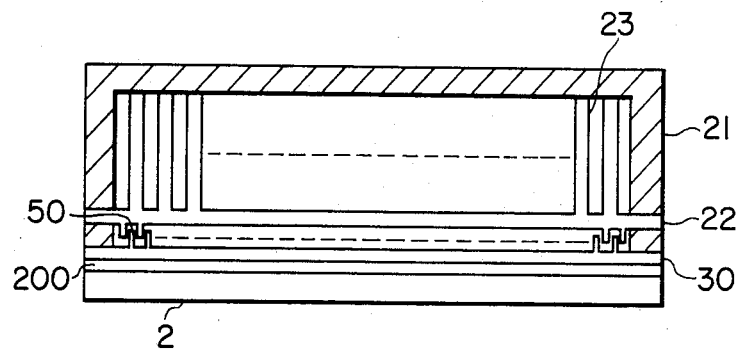
FIG. 5 is a schematic sectional view of the cooling member and the integrated circuit chip of another embodiment of the present invention.

The embodiment of FIG. 5 corresponds to FIG. 3 but differs from FIG. 3 in that the bellows 10 are not shown.

Referring to FIG. 5, a gas having a high thermal conductivity, for example, helium is enclosed in the space between the suction plate 30 and the bottom plate 22 of the cooling block 20, in lieu of the liquid metal 40. However, since a reduction of the thermal conductivity is inevitable, intermeshing minute grooves 50 are formed on the opposing surfaces of the suction plate 30 and bottom plate 22 respectively, and the grooves 50 of suction plate 30 are inserted into the grooves 50 of the bottom plate 22 so as to increase the area of the opposing surfaces of these plates 30 and 32.

Figure 6:
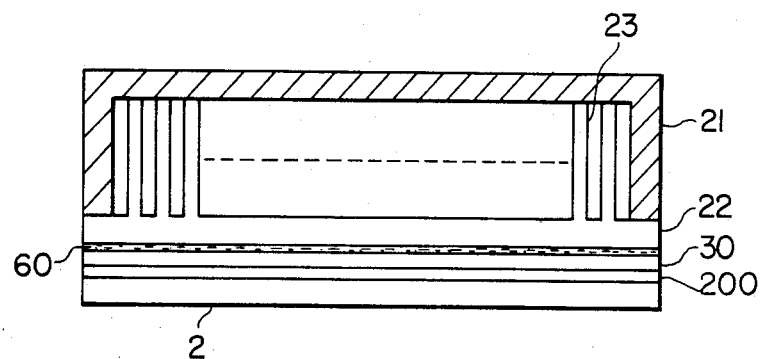
FIG. 6 is a schematic sectional view of the cooling member and the integrated circuit chip in still another embodiment of the present invention.

Referring to FIG. 6, a layer of a metal 60 having a low melting point is used to secure the suction plate 30 to the bottom plate 22 of the cooling block 20 whereby it is possible for the structure of the cooling device to be greatly simplified.

The cooling device shown in FIG. 6 is assembled by first bringing the integrated circuit chip 2 into contact with the suction plate 30 with the silicone oil layer 200 interposed therebetween and producing negative hydrostatic pressure to cause deflection or bending of the suction plate 30 following up warping of the associated integrated circuit chip 2. Then, the cooling block 20 including the cap 21 and bottom plate 22 is pressed onto the other surface of the suction plate 30 while interposing therebetween a foil of the low melting metal 60 having a required thickness, and the foil of the low melting metal 60 is fused and, then, allowed to solidify thereby securing the cooling block 20 to the suction plate 30. It is apparent that, in order to ensure wettability of the low melting metal 60, necessary metalized films may be previously formed on the opposing surfaces of the suction plate 30 and the bottom plate 22 respectively.

The melting point of the low melting metal 60 should lie within a temperature range which will not adversely affect the surface tension of, for example, the silicone oil 200. A metal, for example, an In-Sn alloy having a melting point of 117° C. can be used as the metal 60.

It will be understood from the foregoing detailed description that the present invention provides an integrated circuit chip cooling device of surface-to-surface contact type in which cooling member makes contact with an associated integrated circuit chip with a low thermal resistance therebetween. Therefore, the maintainability and reliability of the cooling device can be improved without degrading the cooling efficiency.

We claim:

1. An integrated circuit chip cooling device comprising:
    a wiring substrate means for mounting a plurality of integrated circuit chips thereon;
    a plurality of cooling blocks associated with respective integrated circuit chips, each of said cooling blocks having an internal space through which a coolant flows;
    suction means associated with the respective integrated circuit chips and said cooling blocks, each of said suction means including a suction plate having a surface formed with grooves disposed in opposition to the respective integrated circuit chips and a liquid interposed between said grooved surface and said associated integrated circuit chip, whereby said integrated circuit chip is sucked by said liquid to said surface formed with said groove;
    thermal conductivity means corresponding to said integrated circuit chips, each of said thermal conductivity means being interposed between said suction plate and said cooling block to connected said suction plate with said cooling block and absorb a deflection of said suction plate;
    resilient pipe means connected with said cooling blocks for supplying coolant to said cooling blocks and being adapted to expand and contract in a direction orthogonal with respect to said wiring substrate; and
    a hat disposed in opposition to said wiring substrate and having an internal coolant passage for introducing said coolant into said resilient pipe means, said hat being bonded to marginal edges of said wiring substrate to hermetically seal said plural integrated circuit chips.

2. An integrated circuit chip cooling device as claimed in claim 1, wherein each of said cooling blocks includes a bottom plate, cooling fins formed integrally with said bottom plate, and a cap mounted on said bottom plate.

3. An integrated circuit chip cooling device as claimed in claim 1 wherein each of said resilient pipe means has a flat-oval sectional shape.

4. An integrated circuit chip cooling device as claimed in claim 1, wherein said thermal conductivity means includes a high thermal conductivity fluid interposed between a bottom plate of each of said cooling blocks and associated suction plate for enclosing therein a fluid having a hig thermal conductivity.

5. An integrated circuit chip cooling device as claimed in claim 1, wherein said thermal conductivity means includes grooves formed on surfaces of a bottom plate of each of said cooling blocks and an opposing surface of an associated one of said suction plates and projections provided between grooves of one of said bottom plate and said suction plate for enabling a connection of said bottom plate with said suction plate.

6. An integrated circuit chip cooling device as claimed in claim 1, wherein said thermal conductivity means includes a low melting metal having a melting point lying with a temperature range which does not adversely affect a surface tension of said liquid, said low melting metal connecting said suction means with a bottom plate through said liquid.

7. An integrated circuit chip cooling device comprising:
    an integrated circuit chip;
    a cooling block having an internal space through which a coolant flows;
    a suction means disposed between said integrated circuit chip and said cooling block, said suction means including a suction plate having a grooved surface formed with grooves disposed in opposition to said integrated circuit chip and a liquid interposed between said grooved surface and said integrated circuit chip, whereby said integrated circuit chip is drawn to said grooved surface by said liquid; and
    thermal conductivity means interposed between said suction plate and said cooling block to connect said suction plate with said cooling block and absorb a deflection of said suction plate.

8. An integrated circuit chip cooling device as claimed in claim 7, wherein said thermal conductivity means includes a high thermal conductivity fluid interposed between a bottom plate of said cooling block and said suction plate.

9. An integrated circuit chip cooling device as claimed in claim 8, wherein a cavity is formed adjacent to peripheral edges of said bottom plate to serve as a reservoir for said high thermal conductivity fluid.

10. An integrated circuit chip cooling device as claimed in claim 9, wherein said bottom plate is made of a metal selected from the group including copper and aluminum.

11. An integrated circuit chip cooling device as claimed in claim 10, wherein said bottom plate is plated with a metal selected from the group including chromium and nickel at the area contacted by said high thermal conductivity fluid.

12. An integrated circuit chip cooling device as claimed in claim 11, wherein said high thermal conductivity fluid is a liquid-phase Ga-In-Sn alloy.

13. An integrated circuit chip cooling device as claimed in claim 8, wherein said bottom plate and said suction plate are secured together at their outer peripheral portions by soldering.

14. An integrated circuit chip cooling device as claimed in claim 7, wherein said liquid is silicone oil.

15. An integrated circuit chip cooling device as claimed in claim 7, wherein a width of said grooves formed on said suction plate is progressively narrowed and widened toward and away from said integrated circuit chip respectively, and said grooves communicate with each other through cavities.

16. An integrated circuit chip cooling device as claimed in claim 7, wherein said thermal conductivity means includes grooves formed on surfaces of a bottom plate of said cooling block and an opposing surface of said suction plate, and projections provided between grooves of one of said bottom plate and said suction plate for insertion into the other of said bottom plate and suction plate for enabling a connection of said bottom plate with said suction plate.

17. An integrated circuit chip cooling device as claimed in claim 16, wherein a gas having a high thermal conductivity is enclosed between said bottom plate of said cooling block and said suction plate inserted into each other.

18. An integrated circuit chip cooling device as claimed in claim 17, wherein said high thermal conductivity gas is helium.

19. An integrated circuit chip cooling device as claimed in claim 7, wherein said thermal conductivity means inludes a low melting. metal having a melting point lying within a temperature range which does not adversely affect a surface tension of said liquid, said low melting metal connecting said suction plate with a bottom plate through said liquid.

20. An integrated circuit chip cooling device as claimed in claim 19, wherein said low melting device is an In-Sn alloy.

* * * * *